(12) United States Patent
Chern

(10) Patent No.: US 10,950,601 B2
(45) Date of Patent: Mar. 16, 2021

(54) CURRENT SOURCE USING EMITTER REGION AS BASE REGION ISOLATION STRUCTURE

(71) Applicant: Nexchip Semiconductor Corporation, Anhui (CN)

(72) Inventor: Geeng-Chuan Chern, Anhui (CN)

(73) Assignee: NEXCHIP SEMICONDUCTOR CORPORATION, Anhui (CN)

( * ) Notice: Subject to any disclaimer, the term of this patent is extended or adjusted under 35 U.S.C. 154(b) by 64 days.

(21) Appl. No.: 16/383,917

(22) Filed: Apr. 15, 2019

(65) Prior Publication Data
US 2020/0273859 A1 Aug. 27, 2020

(30) Foreign Application Priority Data
Feb. 25, 2019 (CN) .......................... 201910138997.X

(51) Int. Cl.
*H01L 27/082* (2006.01)
*H01L 29/08* (2006.01)
*H01L 29/10* (2006.01)
*H01L 29/732* (2006.01)
*H01L 29/06* (2006.01)
*G05F 3/26* (2006.01)
*H01L 21/8222* (2006.01)
(Continued)

(52) U.S. Cl.
CPC .......... *H01L 27/0823* (2013.01); *G05F 3/265* (2013.01); *H01L 21/28518* (2013.01); *H01L 21/762* (2013.01); *H01L 21/8222* (2013.01); *H01L 29/0649* (2013.01); *H01L 29/0804* (2013.01); *H01L 29/0821* (2013.01); *H01L 29/1004* (2013.01); *H01L 29/45* (2013.01); *H01L 29/6628* (2013.01); *H01L 29/7327* (2013.01)

(58) Field of Classification Search
CPC ............. H01L 21/28518; H01L 21/762; H01L 21/8222; H01L 27/0823; H01L 29/0649; H01L 29/0804; H01L 29/0821; H01L 29/1004; H01L 29/45; H01L 29/6628; H01L 29/7327; H01L 29/0603; H01L 29/0684; H01L 27/0207; H01L 21/784; G05F 3/265
USPC ......................................................... 257/526
See application file for complete search history.

(56) References Cited

U.S. PATENT DOCUMENTS 4,084,174 A * 4/1978 Crippen .............. H01L 27/0233
257/474
6,255,713 B1 7/2001 Chi
(Continued)

*Primary Examiner* — Duy T Nguyen
(74) *Attorney, Agent, or Firm* — Muncy, Geissler, Olds & Lowe, P.C.

(57) ABSTRACT

A current source includes a substrate, a base region of a first doping type formed in the substrate, an emitter region of a second doping type formed in the substrate and surrounding the base region, a first collector region of the second doping type formed in the base region, and at least one second collector region of the second doping type formed in the base region, wherein the emitter region includes a deep-well portion and an extending portion, the deep-well portion situated beneath the base region, the extending portion laterally surrounding the base region, the extending portion joined at its bottom to the deep-well portion, the extending portion being flush at its top with a top surface of the substrate. A method of forming the current source is also disclosed.

9 Claims, 5 Drawing Sheets

(51) Int. Cl.
*H01L 21/762* (2006.01)
*H01L 21/285* (2006.01)
*H01L 29/66* (2006.01)
*H01L 29/45* (2006.01)

(56) References Cited

U.S. PATENT DOCUMENTS

2002/0130390 A1* 9/2002 Ker .................... H01L 27/0255
  257/546
2014/0361367 A1* 12/2014 Tseng ................... H01L 21/761
  257/345
2015/0048459 A1* 2/2015 Marinet ............... H01L 27/092
  257/370

* cited by examiner

CURRENT SOURCE USING EMITTER REGION AS BASE REGION ISOLATION STRUCTURE

CROSS-REFERENCE TO RELATED APPLICATION

This application claims the priority of Chinese patent application number 201910138997.X filed on Feb. 25, 2019, the entire contents of which are incorporated herein by reference.

TECHNICAL FIELD

The present invention relates to semiconductor technology and, in particular, to a current source and a method of forming the current source.

BACKGROUND

Current sources are basic circuit elements that are widely used. Examples of commonly used current sources include mirrored current source, proportional current source, and so on. Generally, a current source contains multiple transistors which define an input terminal and at least an output terminal, and an input current can be mirrored to the output terminal. However, it is difficult for existing current sources to be integrated with semiconductor logic devices.

For example, U.S. Pat. No. 6,255,713B1 discloses a current source shown in FIG. 1. As shown, the current source includes an N-doped emitter region (N-Well), a P-doped base region (P-Well) over the emitter region and a plurality of N-doped collector regions within the base region, which together constitute a plurality of bipolar transistors for current mirroring. In addition, the bipolar transistors are isolated by a trench isolation structure (OX). Specifically, as shown in FIG. 1, the trench isolation structure (OX) surrounds and isolates the base region (P-Well) of the current source, while not blocking the emitter region (N-well) in order to allow a signal to be led out from the emitter region. To this end, a depth of the trench isolation structure (OX) within the substrate is required to exceed a depth of the base region (P-Well) and be small than a depth of the emitter region (N-Well).

Therefore, the above current source requires the trench isolation structure to penetrate deeper than the base region in order to isolate the base region. However, it will be recognized that this is contradictory to the current practice in contemporary semiconductor technology to usually fabricate a trench isolation structure not deeper than a base region (P-Well). Thus, the above current source is incompatible with other semiconductor logic devices due to its demand for the deeper trench isolation structure.

SUMMARY OF THE INVENTION

It is an objective of the present invention to propose a novel current source to overcome the problem with existing current sources of incompatibility with other semiconductor logic devices.

To solve the above problem, the present invention provides a current source comprising:
a substrate;
a base region of a first doping type, formed in the substrate;
an emitter region of a second doping type, formed in the substrate and surrounding the base region, the emitter region comprising a deep-well portion and an extending portion, the deep-well portion situated beneath the base region, the extending portion laterally surrounding the base region, the extending portion joined at a bottom thereof to the deep-well portion, the extending portion being flush at a top thereof with a top surface of the substrate;
a first collector region of the second doping type, formed in the base region in the substrate; and
at least one second collector region of the second doping type, formed in the base region in the substrate.

Optionally, the current source may further comprise a base contact region of the first doping type formed in the base region in the substrate, the base contact region and the first collector region being electrically connected.

Optionally, each of the base contact region and the first collector region may extend to the top surface of the substrate and may be covered by a metal silicide so as to be electrically connected through the metal silicide.

Optionally, the base contact region may have a doping concentration higher than a doping concentration of the base region, and wherein the base contact region may have a portion situated between the first and second collector regions that is next to and in contact with the first collector region.

Optionally, the base contact region may comprise a portion situated between the extending portion and the first collector region.

Optionally, the portion of the base contact region situated between the extending portion and the first collector region may be next to and in contact with the extending portion.

Optionally, the base contact region may comprise a portion situated between the extending portion and the second collector region.

Optionally, the portion of the base contact region situated between the extending portion and the second collector region may be next to and in contact with the extending portion.

Optionally, the current source may further comprise a buried region of the second doping type connected to both the deep-well portion and the base region, wherein the buried region may have a doping concentration higher than a doping concentration of the deep-well portion.

Optionally, the current source may further comprise an emitter contact region of the second doping type formed in the extending portion, wherein the emitter contact region may have a doping concentration higher than a doping concentration of the extending portion.

Optionally, the current source may further comprise a trench isolation structure formed in the substrate, the trench isolation structure delimiting an active area in which the base region is formed, the trench isolation structure extending within the substrate to a depth less than a depth of the base region.

It is another objective of the present invention to provide a method of forming a current source, the method comprising:
providing a substrate;
forming a base region of a first doping type and an emitter region of a second doping type in the substrate, the emitter region comprising a deep-well portion and an extending portion, the deep-well portion situated beneath the base region, the extending portion laterally surrounding the base region, the extending portion joined at a bottom thereof to the deep-well portion, the extending portion being flush at a top thereof with a top surface of the substrate; and forming a first collector region of the second doping type and at least one second collector region of the second doping type in the base region.

Optionally, the method may further comprise forming a buried region of the second doping type in the substrate, the buried region connected to both the deep-well portion and the base region and having a doping concentration higher than a doping concentration of the deep-well portion.

Optionally, the method may further comprise forming a base contact region of the first doping type in the base region, the base contact region extending to the top surface of the substrate.

Optionally, the base contact region may have a doping concentration higher than a doping concentration of the base region, and the base contact region may comprise a portion situated between the first and second collector regions.

Optionally, the base contact region may comprise a portion situated between the extending portion and the first collector region, and another portion situated between the extending portion and the second collector region.

Optionally, the method may further comprise forming metal silicides on the substrate, wherein the metal silicides overlying the first collector region, the second collector region and the base contact region.

Optionally, the base contact region may comprise a portion closer to the first collector region than to the second collector region, and wherein the metal silicide overlying the base contact region and close to the first collector region may be joined to the metal silicide overlying the first collector region.

Optionally, the method may further comprise, subsequent to the formation of the emitter region, forming an emitter contact region of the second doping type in the extending portion of the emitter region, the emitter contact region having a doping concentration higher than a doping concentration of the extending portion.

Optionally, the method may further comprise: forming a trench isolation structure in the substrate to delimit an active area, and wherein the base region is formed in the active area, and the trench isolation structure extends within the substrate to a depth less than a depth of the base region.

In the current source of the present invention, the emitter region composed of the deep-well portion and the extending portion surrounds and isolates the base region. That is, the emitter region constitutes part of the bipolar transistors in the current source while functioning to isolate the base region. Compared to conventional current sources relying the trench isolation structure for isolation of the base region, isolating the base region directly by the emitter region in accordance with the present invention can circumvent limitations arising from the reliance on the trench isolation structure, allowing a reduction in device size. As a result, even when the trench isolation structure is fabricated by an existing semiconductor process and has a depth less than that of the base region, electrical isolation of the current source can still be attained, allowing integration of the components thereof with other semiconductor logic devices.

Figure 1:
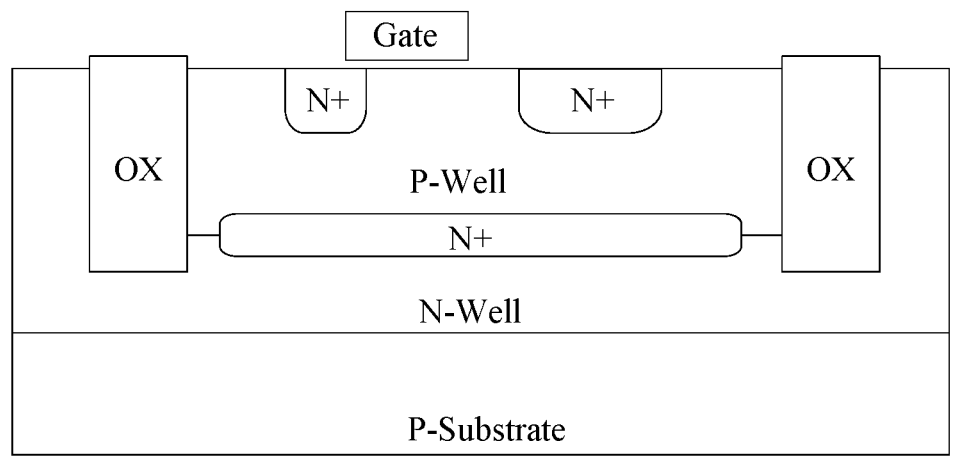
FIG. 1 is a structural schematic of an existing current source.

LIST OF REFERENCE NUMERALS IN DRAWINGS 100 substrate
101 substrate contact region
110B base region
111B base contact region
110E emitter region
111E deep-well portion
112E extending portion
113E emitter contact region
110C1 first collector region
110C2 second collector region
120 buried region
130 trench isolation structure
200 dielectric layer
210 metal silicide
220 contact plug
230 metal pad
240 mask layer

DETAILED DESCRIPTION

Specific embodiments of the proposed current source and method will be described in detail below with reference to accompany drawings. Advantages and features of the present invention will become more apparent from the following description. It is noted that the figures are much simplified and may not be drawn to scale, and the sole purpose of them is to facilitate easy and clear explanation of the embodiments.

Figure 2A:
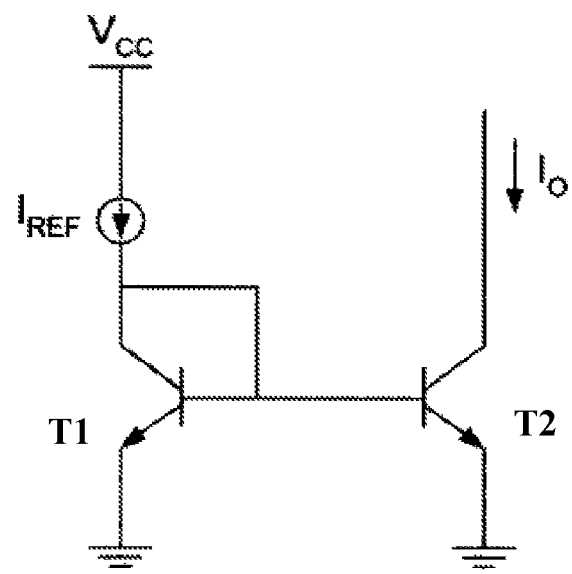
FIG. 2a is an equivalent circuit diagram of a current source.
Figure 2B:
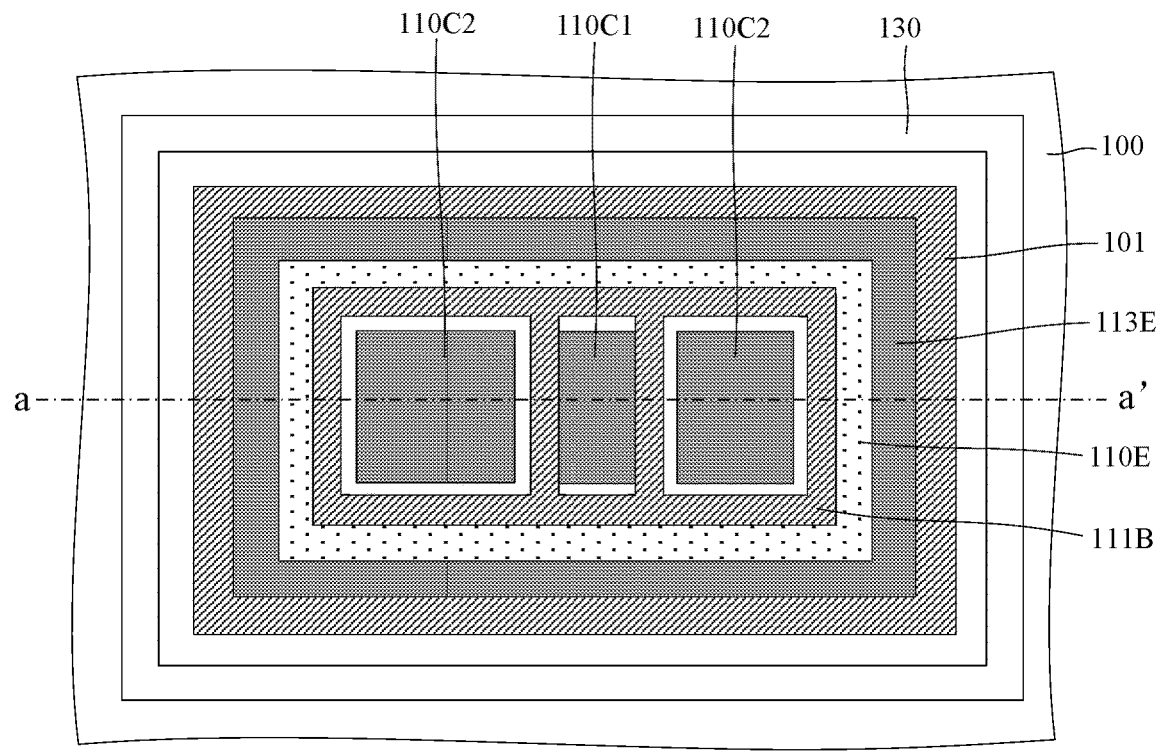
FIG. 2b depicts a layout of a current source according to an embodiment of the present invention.
Figure 2C:
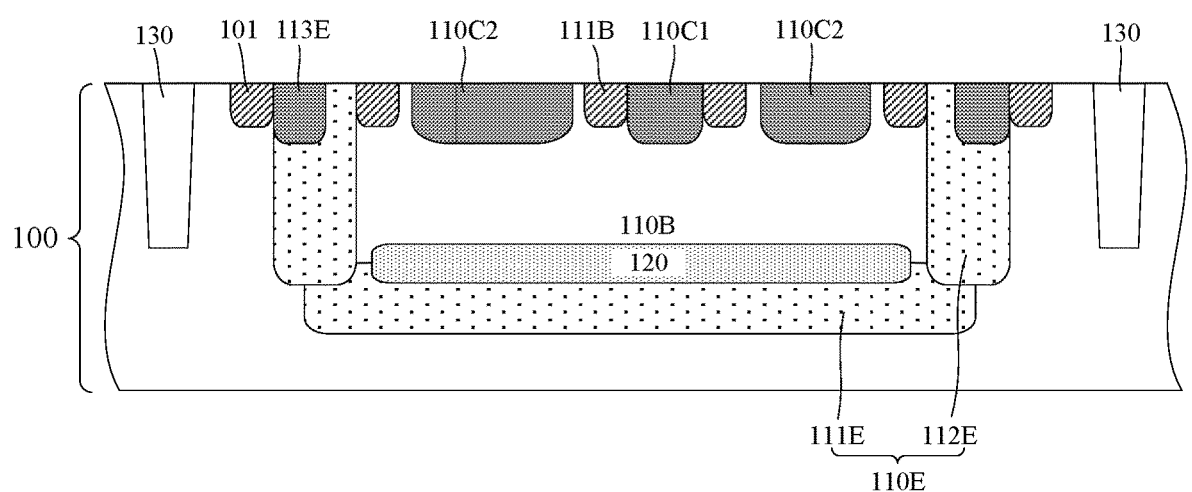
FIG. 2c is a schematic cross-sectional view of the current source of FIG. 2b taken along a-a' line.

FIG. 2a is an equivalent circuit diagram of a current source. FIG. 2b depicts a layout of a current source according to an embodiment of the present invention. FIG. 2c is a schematic cross-sectional view of the current source of FIG. 2b taken along line a-a'. With combined reference to FIGS. 2a to 2c, the current source includes:

a substrate 100;

a base region (base) 110B of a first doping type, formed in the substrate 100;

an emitter region (emitter) 110E of a second doping type, which is formed in the substrate 100 so as to surround the base region 110B, the emitter region 110E including a deep-well portion 111E and an extending portion 112E, the deep-well portion 111E situated beneath the base region 110B, the extending portion 112E laterally surrounding the base region 110B, the extending portion 112E joined at the bottom to the deep-well portion 111E, the extending portion 112E flush at the top with a top surface of the substrate 100; and a first collector region (reference collector) 110C1 of the second doping type and at least one second collector region (output collector) 110C2 of the second doping type, the first and second collector regions 110C1, 110C2 both formed in the base region 110B in the substrate 100, the first and second collector regions 110C1, 110C2 both flush at the top with the top surface of the substrate 100.

It is noted that the first doping type and the second doping type are opposite doping types. For example, the first doping type may be the N type, with the second doping type being the P type. Alternatively, the first doping type may be the P type, with the second doping type being the N type. This embodiment will be described in the context where the first and second doping types are the P and N types, respectively, as an example. That is, in this embodiment, the base region 110B is a P-region, while the emitter region 110E and the first and second collector regions 110C1, 110C2 are all N-regions.

The first collector region 110C1 may be part of an input transistor T1 of the current source and connected to a power supply Vcc in order to receive a reference current $I_{REF}$. The second collector region 110C2 may be part of an output transistor T2 of the current source and configured to produce an output current $I_O$ based on the reference current $I_{REF}$.

It will be recognized that the current source may either include only one second collector region 110C2 or a plurality of second collector regions 110C2. For example, two, three, four or another number of second collector regions 110C2 may be included. In the latter case, the second collector regions 110C2 may be scattered around the first collector region 110C1. This embodiment will be described with the current source having two second collector regions 110C2 formed on opposing sides of the first collector region 110C1 as an example.

As shown in FIG. 2c, the deep-well portion 111E and the extending portion 112E in the emitter region 110E directly surround and isolate the base region 110B. In other words, the emitter region 110E not only constitutes part of the bipolar transistors in the current source but also serves to isolate the base region 110B. Specifically, in this embodiment, as the substrate 100 is of the first doping type (e.g., the P type), PN junction isolation is enabled by the emitter region 110E of the second doping type.

Compared to the existing current source in which the base region is isolated by the trench isolation structure, the base region 110B is directly isolated by the emitter region 110E in accordance with this embodiment, circumventing the limitations arising from the reliance on the trench isolation structure and thus facilitating the compatibility of the bipolar transistors in the inventive current source with semiconductor CMOS logic devices, such as those of the 90-, 65-, 55- and 40-nm process nodes.

Specifically, in this embodiment, the current source may, for example, include a trench isolation structure 130 formed in the substrate 100 in order to delimit an active area of the current source. The bipolar transistors of the current source are formed in the active area. That is, regardless of whether a depth the trench isolation structure 130 extends within the substrate is greater than a depth of the base region 110B or not, the devices of the current source can always be compatible with other semiconductor logic devices (e.g., COMS logic devices).

With continued reference to FIGS. 2b and 2c, in this embodiment, the current source may further include a base contact region 111B of the first doping type, which is formed in the base region 110B and has a doping concentration higher than that of the base region 110B in order to allow the lead out of a signal from the base region 110B. The base contact region 111B may be electrically connected to the same power supply Vcc to which the first collector region 110C1 is electrically connected.

Figure 2D:
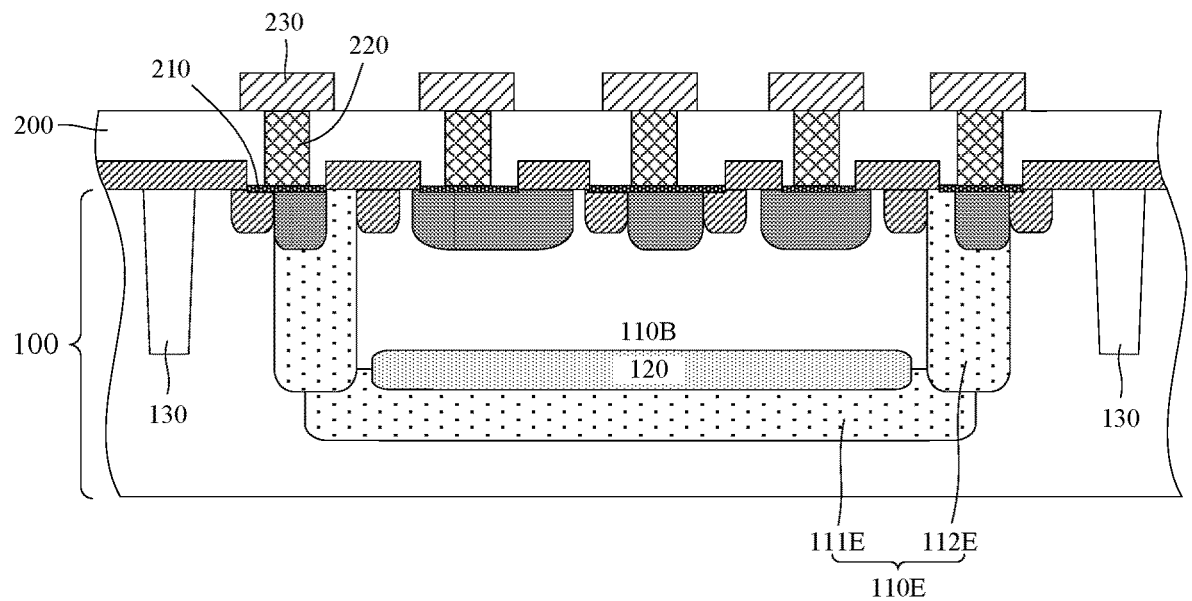
FIG. 2d schematically shows how components of a current source are interconnected in accordance with an embodiment of the present invention.

FIG. 2d schematically shows how the components of the current source are interconnected in accordance with an embodiment of the present invention. With combined reference to FIGS. 2b and 2d, the base contact region 111B and the first and second collector regions 110C1, 110C2 are all flush with the top surface of the substrate 100 and covered by respective metal silicides 210 thereon configured for signal lead out. That is, both the base contact region 111B and first collector region 110C1 are electrically connected via the overlying metal silicides 210. In this manner, the signal of each of the base region 110B and the first and second collector regions 110C1, 110C2 can be led out at a low contact resistance.

It is noted that existing current sources (e.g., that shown in FIG. 1) may include a gate structure (gate) and establish a collector-base-emitter current path based on gate-induced drain leakage (GIDL). That is, in the current source of FIG. 1, the base and collector regions are connected equivalently through a resistance in series rather than by direct contact. This impacts the current source performance.

In contrast, in this embodiment, the base region 110B and the first collector region 110C1 rely on the metal silicides 210 for direct electrical contact, whose very low contact resistances allow the current source to have a favorable performance.

In an alternative embodiment, the base contact region 111B may have a portion closer to the first collector region 110C1 than to the second collector region 110C2, which can facilitate the connection of both the base contact region 111B and the first collector region 110C1 to the same power supply.

With continued reference to FIGS. 2b and 2c, in this embodiment, a border of the base contact region 111B may partially overlap with a border of the first collector region 110C1. That is, since the base contact region 111B has a portion next to and in direct contact with the first collector region 110C1, the metal silicide on the base contact region 111B is allowed to be joined to that on the first collector region 110C1. In other words, the base contact region 111B and the first collector region 110C1 can be directly connected to the same metal silicide which electrically connects them to the power supply.

Further, the base contact region 111B may have portions situated between the first and second collector regions 110C1, 110C2. Additionally, the portions of the base contact region 111B between the first and second collector regions 110C1, 110C2 may be next to or border the first collector region 110C1. In this way, the lateral sides of the first collector region 110C1 that face the second collector regions 110C2 come into contact with the heavier-doped base contact regions 111B, alleviating current leakage occurring due to a parasitic transistor formed by the first and second collector regions 110C1, 110C2 neighboring to each other.

Specifically, as the first and second collector regions 110C1, 110C2 are formed adjacent to each other in the same base region 110B, it is easy for parasitic transistors (e.g., parasitic NPN transistors) to be formed. Moreover, since the first collector region 110C1 serves as an input terminal of the current source, carriers injected from the emitter region 110E into the base region 110B during operation of the current source are ultimately collected by the first collector region 110C1. As a result, the first collector region 110C1 functions as a collector electrode of the parasitic transistors formed by the first and second collector regions 110C1, 110C2.

In this respect, according to this embodiment, since the lateral sides of the first collector region 110C1 that face the second collector regions 110C2 are in contact with the heavier-doped base contact region 111B, concentration gradients present between the base contact region 111B and the base region 110B (the doping concentration of the base contact region 111B is higher than that of the base region 110B) create electrical fields around the lateral sides of the first collector region 110C1, which can suppress the migration of carriers in the first collector region 110C1 in the parasitic transistors formed by the first and second collector regions 110C1, 110C2 (where the first collector region 110C1 serves as a collector electrode) and thus alleviate current leakage in the current source due to parasitic effects.

Thus, in this embodiment, the base contact region 111B not only serves for signal lead out and electrical connection of the base region 110B, but also provides a guard ring of the second doping type, which can alleviate parasitic effects between the first collector region 110C1 and the adjacent second collector regions 110C2.

Additionally, in the current source according to this embodiment, the emitter region 110E laterally surrounds the base region 110B and is flush with the top surface of the substrate, so the first collector region 110C1 and/or the second collector regions 110C2 is/are laterally close to the extending portion 112E. For example, in this embodiment, the first collector region 110C1 is laterally close to the extending portion 112E in the direction perpendicular to the direction of line a-a', while the second collector regions 110C2 are laterally close to the extending portion 112E along the direction of line a-a'. For this reason, parasitic transistors (e.g., parasitic NPN transistors) may be laterally formed between the first collector region 110C1 and the extending portion 112E and between the second collector regions 110C2 and the extending portion 112E.

In order to avoid this, the base contact region 111B may further include portions between the first collector region 110C1 and the extending portion 112E. Optionally, the portions of the base contact region 111B between the first collector region 110C1 and the extending portion 112E may border the extending portion 112E. Moreover, the base contact region 111B may also include portions between the second collector regions 110C2 and the extending portion 112E. Optionally, the portions of the base contact region 111B between the second collector regions 110C2 and the extending portion 112E may border the extending portion 112E. In this way, parasitic effects occurring between the first collector region 110C1 and the extending portion 112E and between the second collector regions 110C2 and the extending portion 112E can be suppressed.

It is noted that, in this embodiment, since the base contact region 111B partially borders the extending portion 112E, the current source is allowed to significantly shrink in size. However, it will be recognized that, in other embodiment, the base contact region 111B may also not border the extending portion 112E.

With continued reference to FIGS. 2b and 2c, the current source may optionally include a buried region 120 of the second doping type, which is connected to both the deep-well portion 111E and the base region 110B and has a doping concentration higher than that of the deep-well portion 111E. It will be appreciated that the buried region 120 may constitute part of the emitter region 110E. During operation of the current source, the heavier-doped buried region 120 can provide the base region 110B with more carriers, improving the performance of the current source.

Optionally, the buried region 120 may be formed at a certain depth in the substrate and laterally extend under the first and second collector regions 110C1, 110C2. It will be appreciated that the buried region 120 is located below both of the first and second collector regions 110C1, 110C2.

The current source may further include an emitter contact region 113E of the second doping type, which is located within the extending portion 112E of the emitter region 110E and flush with the top surface of the substrate 100. Moreover, the emitter contact region 113E has a doping concentration higher than that of the extending portion 112E and is configured for signal lead out of the emitter region 110E. For example, the emitter region 110E may be electrically grounded via the emitter contact region 113E.

Similarly, the emitter contact region 113E may also be provided with an overlying metal silicide 210 on the substrate top surface, which can accomplish the electrical connection of the emitter region 110E at a low contact resistance.

Optionally, a substrate contact region 101 of the first doping type may be formed in the substrate 100 so as to be farther from the base region 110B than from the extending portion 112E and configured for signal lead out of the substrate 100. For example, the substrate contact region 101 may also be electrically grounded. Similarly, a metal silicide on the substrate top surface may reside on the substrate contact region 101.

In this embodiment, since the emitter contact region 113E and the substrate contact region 101 can be both grounded, the emitter contact region 113E is allowed to be formed at an end of the extending portion 112E distal from the base region 110B and the substrate contact region 101 is allowed to border the extending portion 112E, so that the substrate contact region 101 comes into contact with the emitter contact region 113E. As shown in FIG. 2d, the metal silicide on the substrate contact region 101 may be joined to the metal silicide on the emitter contact region 113E to allow the simultaneous electrical grounding of the substrate contact region 101 and the emitter contact region 113E. Of course, in other embodiments, the substrate contact region 101 may also not border the emitter contact region 113E.

With continued reference to FIG. 2d, an interconnect structure may be formed on the substrate 100, which includes a dielectric layer 200, a plurality of contact plugs 220 and metal pads 230. The dielectric layer 200 is formed on the substrate 100 so as to cover the metal silicides 210. The contact plugs 220 penetrate through the dielectric layer 200 and are electrically connected to the metal silicides 210. The metal pads 230 are formed on the dielectric layer 200 and are electrically connected to tops of the contact plugs 220.

In this embodiment, the metal silicides on the substrate contact region 101 and on the emitter contact region 113E may be connected to a single one of the contact plugs 220. The metal silicides on first collector region 110C1 and on the base contact region 111B may be connected to another single one of the contact plugs 220. This can simplify the layout of the current source.

Referring again to FIG. 2b, in the layout according to this embodiment, the extending portion 112E of the emitter region 110E assumes an annular shape and surrounds the base region 110B. The base contact region 111B extends along the lateral side of the extending portion 112E bordering the base region 110B and hence surrounds the first and second collector regions 110C1, 110C2 formed in the base region 110B. Additionally, the portions of the base contact region 111B between the first and second collector regions 110C1, 110C2 are joined to the remainder thereof bordering the extending portion.

It is noted that, while the base region 110B surrounded by the emitter region 110E, the first collector region 110C1 in the base region 110B and the two rectangular second collector regions 110C2 also in the base region 110B and on opposing sides of the first collector region 110C1 are all shown to be rectangular in this embodiment, they may also assume any other shape in other embodiments, such as circular, elliptic or polygonal.

Furthermore, the second collector regions 110C2 in the current source may have the same area or different areas, depending on the actual need. For example, each of the second collector regions 110C2 may have the same area as the first collector region 110C1 in case of the current source intended to operate as a mirrored current source. Alternatively, the areas of the second collector regions 110C2 may be determined as proportions of the area of the first collector region 110C1 in case of the current source intended to be used as a proportional current source. In this embodiment, the areas of the two second collector regions 110C2 are different from each other, i.e., different proportions of the area of the first collector region 110C1.

Figure 3:
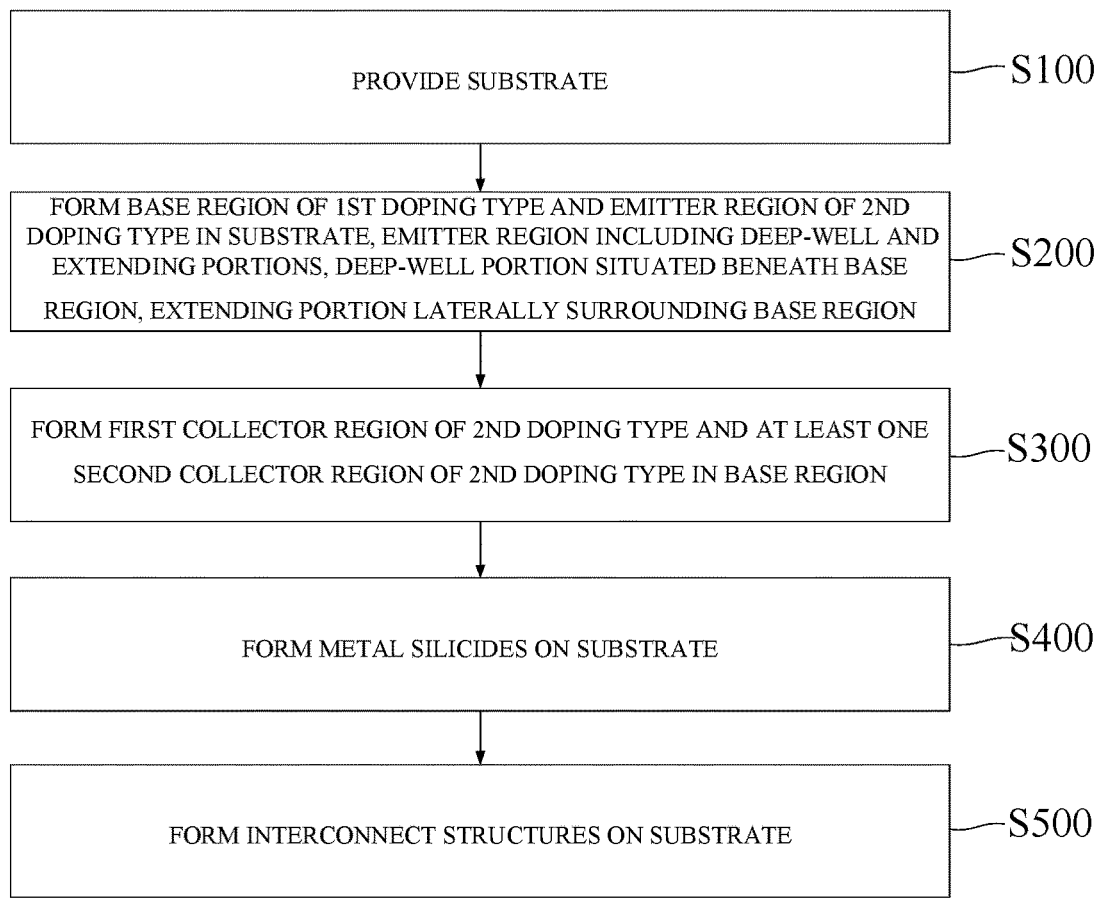
FIG. 3 is a flowchart of a method of forming a current source according to an embodiment of the present invention.

On the basis of the current source as defined above, there is also provided a method of forming a current source in an embodiment. FIG. 3 is a flowchart of a method of forming a current source according to an embodiment of the present invention. FIGS. 4a to 4d are schematic illustrations of structures resulting from steps of a method of forming a current source according to an embodiment of the present invention. These steps will be described in detail below with reference to the figures.

Figure 4A:
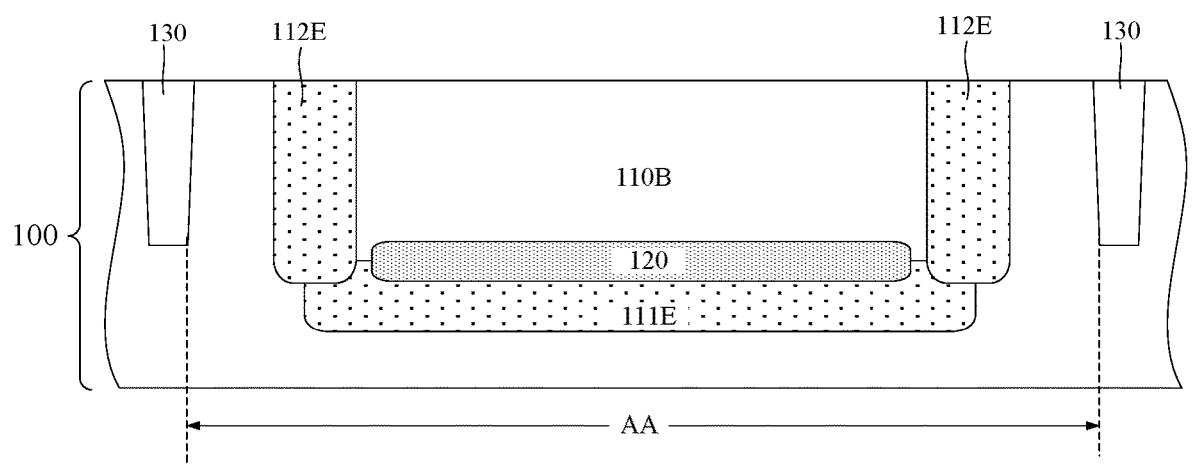
FIGS. 4a to 4d are schematic illustrations of structures resulting from steps of a method of forming a current source according to an embodiment of the present invention.

In step S100, with reference to FIG. 4a, a substrate 100 is provided, which is of, for example, the aforementioned first doping type. In this embodiment, the substrate 100 is a P-type substrate.

Optionally, the substrate 100 may be formed with a trench isolation structure 130 delimiting an active area AA in which bipolar transistors of the current source are to be formed subsequently. Additionally, if the components of the current source are to be subsequently integrated with other semiconductor logic devices, they can be electrically isolated directly by the trench isolation structure 130.

The trench isolation structure 130 may be fabricated using a conventional semiconductor process so that it extends within the substrate, for example, to a first depth.

In step S200, with continued reference to FIG. 4a, a base region 110B of the first doping type and an emitter region of the aforementioned second doping type are formed in the substrate 100. The emitter region includes a deep-well portion 111E and an extending portion 112E. The deep-well portion 111E is located under the base region 110B, and the extending portion 112E laterally surrounds the base region 110B. In addition, the extending portion 112E is connected at the bottom to the deep-well portion 111E and is flush at the top with a top surface of the substrate 100.

As shown in FIG. 4a, in this embodiment, the base region 110B extends to a second depth in the substrate, which is greater than the first depth of the trench isolation structure. In other words, the depth of the trench isolation structure 130 is less than that of the base region 110B. With such a trench isolation structure 130, the subsequently-formed components of the current source can still be compatible with other semiconductor logic devices.

Specifically, the formation of the base region 110B and the emitter region may, for example, include steps of:

a) forming the deep-well portion 111E of the second doping type at a predetermined depth in the substrate 100;

b) forming the extending portion 112E of the second doping type in the substrate 100, the extending portion 112E extending from the top surface of the substrate to the deep-well portion 111E and joined to the deep-well portion 111E;

In this embodiment, the extending portion 112E may surround the deep-well portion 111E along a peripheral edge thereof so that they together surround a portion of the substrate.

c) forming the base region 110B of the first doping type in the portion surrounded by the emitter region.

It is noted that in this embodiment, since the substrate 100 is of the first doping type, subsequent to the formation of the deep-well portion 111E and the extending portion 112E, the portion surrounded together by the deep-well portion 111E and the extending portion 112E is also of the first doping type. This portion can directly make up the base region 110B. Of course, it may also be processed with an ion implantation process so that its doping concentration is altered. In the latter case, the processed portion constitutes the base region 110B.

Optionally, after the emitter region is formed, a buried region 120 of the second doping type may be formed in the substrate 100. The buried region 120 has a doping concentration higher than that of the deep-well portion 111E and is joined to the top of the deep-well portion 111E. Additionally, the buried region 120 extends away from the deep-well portion 111E into the base region 110B so as to connect the deep-well portion 111E to the base region 110B.

Figure 4B:
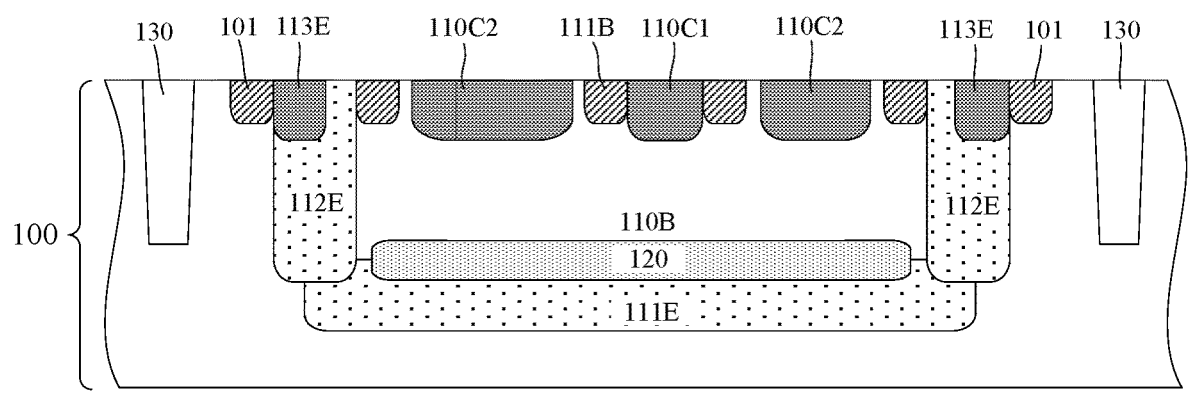

In step S300, with reference to FIG. 4b, a first collector region 110C1 of the second doping type and at least one second collector region 110C2 of the second doping type are formed in the base region 110B. This embodiment will be described in the context of two second collector regions 110C as an example.

Specifically, the first and second collector regions 110C1, 110C2 may be formed in the same ion implantation process. The first and second collector regions 110C1, 110C2 all extend in the substrate from the top surface thereof.

Further, in the course of the formation of the first and second collector regions 110C1, 110C2, an emitter contact region 113E of the second doping type is formed at the same time in the extending portion 112E, which also extends in the substrate from the top surface thereof. In addition, the emitter contact region 113E has a doping concentration higher than that of the extending portion 112E in order to allow lead out of the emitter region.

Further, prior or subsequent to the formation of the first and second collector regions 110C1, 110C2, the method may further include:

forming a base contact region 111B of the first doping type in the base region 110B, which has a doping concentration higher than that of the base region 110B in order to allow signal lead out of the base region 110B.

Specifically, the base contact region 111B has a portion closer to the first collector region 110C1 than to the second collector regions 110C2. This can facilitate connecting both the base contact region 111B and the first collector region 110C1 to a single power supply.

In this embodiment, the base contact region 111B has portions between the first and second collector regions 110C1, 110C2 and bordering the first collector region 110C1. In this way, the base contact region 111B can further alleviate current leakage caused by parasitic transistors formed by the first and second collector regions 110C1, 110C2.

With continued reference to FIG. 4b, the first collector region 110C1 and/or the second collector regions 110C2 in the base region 110B is/are close to the extending portion 112E in the emitter region 110E. As such, the base contact region 111B has a portion between the extending portion 112E and the first collector region 110C1 and bordering the extending portion 112E. Additionally, the base contact region 111B also has portions between the extending portion 112E and the second collector region 110C2 and bordering the extending portion 112E. This can additionally alleviate lateral parasitic effects occurring between the first collector region 110C1 and the extending portion 112E and between the second collector regions 110C2 and the extending portion 112E.

Optionally, the method may further include, during the formation of the base contact region 111B, forming a substrate contact region 101 of the first doping type in the substrate 100, which is located farther from the base region 110B than from the extending portion 112E and configured for external signal connection of the substrate 100.

In this embodiment, both the substrate contact region 101 and the emitter contact region 113E may be electrically grounded. In this case, the substrate contact region 101 and the emitter contact region 113E may be formed close to each other in order to allow them to be electrically connected to the same ground node.

Figure 4C:
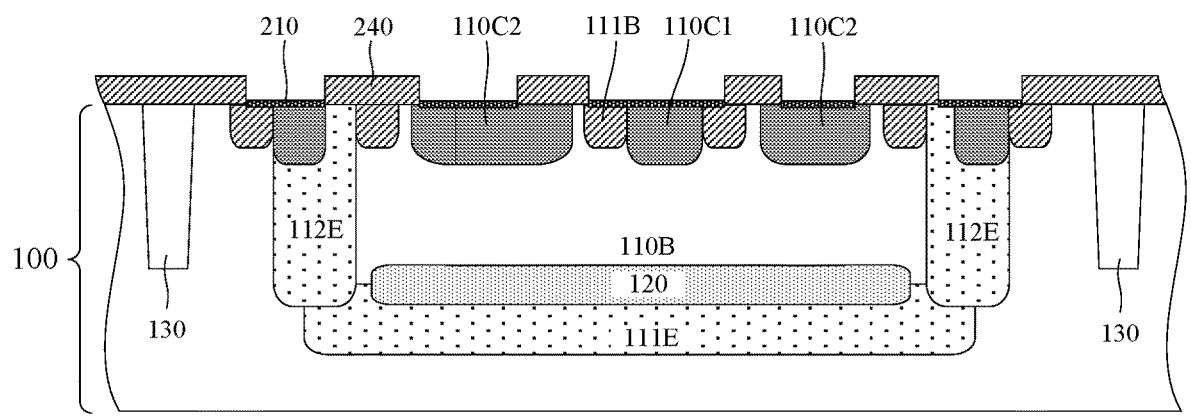

With continued reference to FIG. 3, in conjunction with FIG. 4c, the method may further include, in step S400, forming, on the substrate 100, metal silicides 210 for signal lead out of the previously formed regions, i.e., the first collector region 110C1, the second collector region 110C2, the base contact region 111B, the emitter contact region 113E and the substrate contact region 101.

Specifically, referring to FIG. 4c, the formation of the metal silicide 210 may, for example, include the following steps.

In a first step, a mask layer 240 is formed on the substrate 100 and openings are then formed in the mask layer 240 to expose portions of the underlying substrate where the metal silicides are to be subsequently formed.

In this embodiment, the openings in the mask layer 240 expose the first collector region 110C1, the second collector region 110C2, the base contact region 111B, the emitter contact region 113E and the substrate contact region 101. The first collector region 110C1 and the base contact region 111B that are next to each other are exposed in a single one of the openings. Similarly, the emitter contact region 113E and the substrate contact region 101 that are next to each other are exposed in another single one of the openings.

In a second step, with the mask layer 240 as a protective mask, the metal silicides 210 are formed on the portions of the substrate surface exposed in the openings. The metal silicide on the first collector region 110C1 is joined to the metal silicide on the base contact region 111B. The metal silicide on the emitter contact region 113E is joined to the metal silicide on the substrate contact region 101.

Figure 4D:
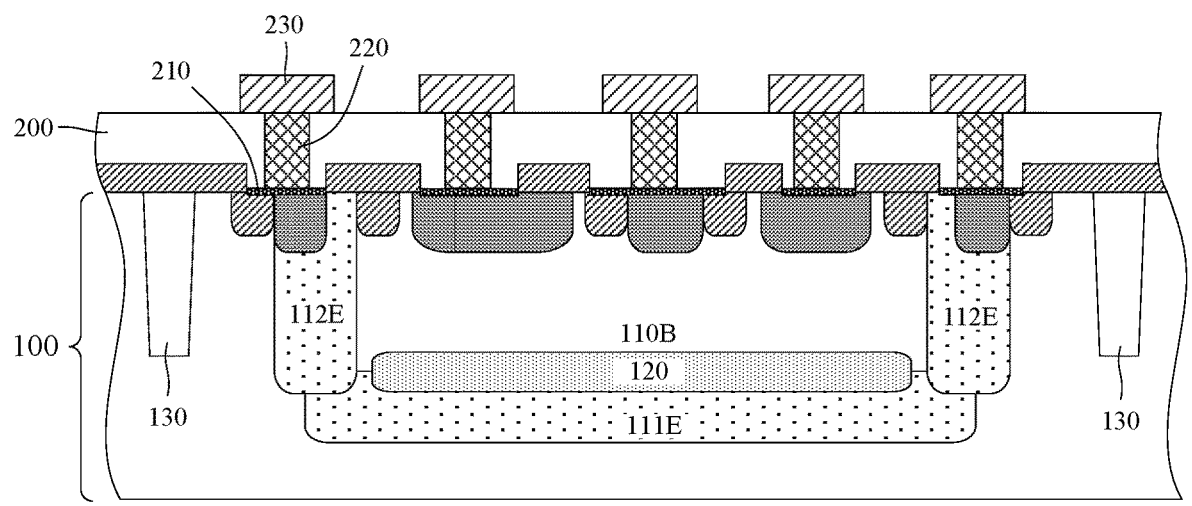

Furthermore, as shown in FIG. 4d, the method may further include, after the formation of the metal silicides 210, in step S500, forming an interconnect structure on the substrate 100, which is configured for signal lead out of the electrodes in the current source.

Specifically, the interconnect structure may include a dielectric layer 200, a plurality of contact plugs 220 in the dielectric layer 200 and a plurality of metal pads 230 on the dielectric layer 200. The contact plugs 220 penetrate through the dielectric layer 200 and are electrically connected to the metal silicides 210. The metal pads 230 are electrically connected to tops of the contact plugs 220.

In summary, in the current source of the present invention comprising the base region, the emitter region, the first collector region and the second collector region, the base region is surrounded by the emitter region made up of the deep-well portion and the extending portion. Therefore, the emitter region constitutes part of the bipolar transistors in the current source while directly isolating the emitter region. In this way, the current source of the present invention circumvents limitations due to the reliance on the relatively deeper trench isolation structure for the isolation, allowing a reduction in device size. Moreover, according to the present invention, the components in the current source can be electrically isolated from and thus compatible with other semiconductor logic devices by means of a relatively moderate trench depth as adopted in conventional processes.

Additionally, the base contact region formed in the base region allows direct electrical lead out of the base region and the first collector region. Compared to series connection of the base region and first collector region based on gate-induced drain leakage (GIDL), the direct electrical lead out of the base region and the first collector region according to the present invention can reduce the input resistance of the current source, which is favorable to its performance.

Further, the portion of the base contact region bordering the first collector region can alleviate parasitic effects occurring between the first collector region and the neighboring second collector region. Furthermore, the portions of the base contact region bordering the extending portion can effectively suppress parasitic effects occurring between the extending portion and the first collector region as well as between the extending portion and the second collector region.

The description presented above is merely that of a few preferred embodiments of the present invention and does not limit the scope thereof in any sense. Any and all changes and modifications made by those of ordinary skill in the art based on the above teachings fall within the scope as defined in the appended claims.

What is claimed is:

1. A current source, comprising:
   a substrate;
   a base region of a first doping type, formed in the substrate;
   an emitter region of a second doping type, formed in the substrate and surrounding the base region, the emitter region comprising a deep-well portion and an extending portion, the deep-well portion situated beneath the base region, the extending portion laterally surrounding the base region, the extending portion joined at a bottom thereof to the deep-well portion, the extending portion being flush at a top thereof with a top surface of the substrate;
   a first collector region of the second doping type, formed in the base region in the substrate;
   at least one second collector region of the second doping type, formed in the base region in the substrate;
   a base contact region of the first doping type formed in the base region in the substrate, the base contact region and the first collector region being electrically connected;
   wherein each of the base contact region and the first collector region extends to the top surface of the substrate and is covered by a metal silicide so as to be electrically connected through the metal silicide.

2. The current source of claim 1, wherein the base contact region has a doping concentration higher than a doping concentration of the base region, and wherein the base contact region has a portion situated between the first and second collector regions that borders the first collector region.

3. The current source of claim 1, wherein the base contact region comprises a portion situated between the extending portion and the first collector region.

4. The current source of claim 3, wherein the portion of the base contact region situated between the extending portion and the first collector region borders the extending portion.

5. The current source of claim 1, wherein the base contact region comprises a portion situated between the extending portion and the second collector region.

6. The current source of claim 5, wherein the portion of the base contact region situated between the extending portion and the second collector region borders the extending portion.

7. The current source of claim 1, further comprising:
a buried region of the second doping type, connected to both the deep-well portion and the base region, wherein the buried region has a doping concentration higher than a doping concentration of the deep-well portion.

8. The current source of claim 1, further comprising:
an emitter contact region of the second doping type, formed in the extending portion, wherein the emitter contact region has a doping concentration higher than a doping concentration of the extending portion.

9. The current source of claim 1, further comprising:
a trench isolation structure formed in the substrate, the trench isolation structure delimiting an active area in which the base region is formed, the trench isolation structure extending within the substrate to a depth less than a depth of the base region.

* * * * *